United States Patent
Partridge et al.

(10) Patent No.: US 7,507,669 B2
(45) Date of Patent: Mar. 24, 2009

(54) GAP TUNING FOR SURFACE MICROMACHINED STRUCTURES IN AN EPITAXIAL REACTOR

(75) Inventors: Aaron Partridge, Palo Alto, CA (US); Markus Lutz, Palo Alto, CA (US)

(73) Assignee: Robert Bosch GmbH, Stuttgart (DE)

( * ) Notice: Subject to any disclaimer, the term of this patent is extended or adjusted under 35 U.S.C. 154(b) by 274 days.

(21) Appl. No.: 10/917,168

(22) Filed: Aug. 12, 2004

(65) Prior Publication Data

US 2005/0014374 A1 Jan. 20, 2005

Related U.S. Application Data

(62) Division of application No. 10/334,463, filed on Dec. 31, 2002, now Pat. No. 6,808,953.

(51) Int. Cl.
*H01L 21/302* (2006.01)
(52) U.S. Cl. .................. 438/696; 438/699; 257/505; 257/518; 257/520
(58) Field of Classification Search .......... 438/696, 438/699; 257/505, 518, 520
See application file for complete search history.

(56) References Cited

U.S. PATENT DOCUMENTS

| | | | |
|---|---|---|---|
| 5,164,790 A | 11/1992 | McNeil et al. | |
| 5,410,346 A | 4/1995 | Saneyoshi et al. | |
| 5,739,909 A | 4/1998 | Blayo et al. | |
| 5,867,276 A | 2/1999 | McNeil et al. | |
| 6,307,242 B1 * | 10/2001 | Sugiyama | 257/432 |
| 6,318,175 B1 * | 11/2001 | Muchow et al. | 73/514.29 |
| 6,429,943 B1 | 8/2002 | Opsal et al. | |
| 6,448,622 B1 | 9/2002 | Franke et al. | |
| 6,627,965 B1 * | 9/2003 | Tuller et al. | 257/415 |
| 2001/0016367 A1 | 8/2001 | Ziegler | |
| 2002/0155711 A1 | 10/2002 | Fischer et al. | |
| 2003/0015729 A1 | 1/2003 | Bosco et al. | |

FOREIGN PATENT DOCUMENTS

| | | |
|---|---|---|
| DE | 100 17 976 | 10/2001 |
| EP | 1 213 261 | 6/2002 |
| WO | WO 01/97279 | 10/2001 |
| WO | WO 02/062698 | 8/2002 |

OTHER PUBLICATIONS

Wolf et al., Silicon Processing for the VLSI Era, 1986, Lattice Press, vol. 1, p. 133, 581.*
English Language Abstract of DE 100 17 976.
English Language Abstract of WO 02/062698 A2.

(Continued)

*Primary Examiner*—Binh X Tran
(74) *Attorney, Agent, or Firm*—Kenyon & Kenyon LLP (57) ABSTRACT

A device includes a top layer having at least two opposing faces, and at least two epitaxially deposited layers, each of the at least two epitaxially deposited layers situated on a respective one of the at least two opposing faces, a combined thickness of the at least two epitaxially deposited layers tuning a gap between the at least two opposing faces.

9 Claims, 6 Drawing Sheets

OTHER PUBLICATIONS

Vescan et al., Oct. 7, 1997, "Epitaxial Growth by Low Pressure Chemical Vapour Deposition of $Si_{1-x}Ge_x/Si$ and Applications" at Semiconductor Conference, 1997. CAS '97 Proceedings., 1997 International Sinaia, Romania Oct. 7-11, 1997, New York, NY, USA, IEEE, US, vol. 2, pp. 405-413.

Galweski et al., May 10, 1988, "Silicon Epitaxy in an LPCVD Furnace" at the Symposium on VLSI Technology, San Diego, May 10-13, 1988, New York, IEEE, US, Institute of Electrical and Electronics Engineers, Proceedings pp. 79-80.

Parker et al., Jun. 21, 1990, "Selective Silicon Epitaxial Growth by LPCVD Using Silane" in Electronic Letters vol. 26, pp. 831-832.

Wagner et al., Aug. 1997, "Thermal Properties of β-SiC Epitaxial Layers Between 150° C and 500° C Measured by Using Microstructures" at the First European Conference on Silicon Carbide and Related Materials (ECSCRM 96) Oct. 6-9, 1996, Heraklion, Greece in Diamond and Related Materials vol. 6, pp. 1338-1341.

Communication from the European Patent Office issued on European Patent Application EP 03 023 819.0, dated Apr. 11, 2008.

* cited by examiner

GAP TUNING FOR SURFACE MICROMACHINED STRUCTURES IN AN EPITAXIAL REACTOR

CROSS-REFERENCE TO RELATED APPLICATION

This application is a division of U.S. patent application Ser. No. 10/334,463, filed on Dec. 31, 2002, now U.S. Pat. No. 6,808,953 which is expressly incorporated herein in its entirety by reference thereto.

FIELD OF THE INVENTION

The present invention relates to manufacture of micromechanical structures, and relates in particular to a method for narrowing a gap between micromachined structures on a device during manufacture in an epitaxial reactor.

BACKGROUND INFORMATION

A method of depositing structural layers during manufacture of surface-micromachined devices sometimes involves the use of an epitaxial reactor. Epitaxy is a process for production of layers of monocrystalline layers of silicon over a single crystal substrate, and for forming polycrystalline silicon layers over other substrate materials, for instance $SiO_2$ films on silicon substrates. Epitaxial reactors may be operated with precisely controlled temperature and environmental conditions to ensure uniform deposition and chemical composition of the layer(s) being deposited on the target substrate. In addition to the precise control, use of an epitaxial reactor may permit build-up of layers on a substrate at significantly higher rates than typically found with LPCVD (Low Pressure Chemical Vapor Deposition) systems.

U.S. Pat. No. 6,318,175 discusses an approach to using epitaxial deposition to create a micromachined device such as a rotation sensor.

While the foregoing micromachining operations or similar processes may provide acceptable products for many applications, some applications may require finer width gaps between the micromachined elements on the device than can be provided by this process. Some applications may require, for instance, obtaining higher working capacitances and/or electrostatic forces between micromachined structures. While etching very narrow trenches to obtain desired narrow gaps has been attempted, these methods may require slower etch rates, may be limited in aspect ratio, and may be subject to limitations of the lithography and etching process. Similarly, germanium has been applied to produce narrow gaps, however, this process may have process compatibility limitations.

Accordingly, there is a need for a process for manufacturing devices which provides product with inter-element gaps that may be precisely defined or "tuned" to meet the device design objectives, while still maintaining satisfactory production rates.

SUMMARY OF THE INVENTION

According to an exemplary embodiment of the present invention, a method for precisely controlling the gap between micromechanical elements on a device, or "gap tuning," begins with a partially formed micromechanical device, which may comprise a substrate layer of, for example monocrystalline silicon or a SiGe mixture. A sacrificial layer of, for example, $SiO_2$ may be deposited on the substrate layer. A functional layer of, for example, epitaxially deposited silicon, may be etched after application to define micromechanical structures or devices thereon.

Once the elements of the micromechanical structure or device have been defined in the function layer and the sacrificial layer, in situ cleaning of the device within the epitaxial reactor may be performed. The cleaning may be performed, for example, with hydrogen ($H_2$) to remove surface oxides, and/or with hydrochloric acid (HCl) to remove silicon residues and surface imperfections resulting from the trench etching process. Following the cleaning step, gap tuning may be performed by selectively depositing an epitaxially-grown layer of silicon on the surface of the partially completed device, and in particular on the sides of the previously etched trenches defining the micromechanical elements in the function layer. As the gap-tuning layer is deposited, the gap width may be monitored, for example with an optical end-point detection system. The gap tuning deposition may be halted when the inter-element gap has been narrowed to the desired extent.

The precision control of the width of the gaps between the micromechanical elements on a device in the foregoing manner may provide several advantages including: ready compatibility with an epitaxial environment and standard epitaxy equipment; high production rates due to the high layer deposition rates that may be achieved in an epitaxial reactor; and ready adaptability to use of different materials to be deposited on the micromachined device, including monocrystalline silicon, polycrystalline silicon, a SiGe mixture, pure germanium, or silicon carbide. Furthermore, the deposited layers may be in situ doped.

An exemplary method may adjust with high precision the width of gaps between micromachined structures or devices in an epitaxial reactor environment, the exemplary method including providing a partially formed micromechanical device, comprising a substrate layer, a sacrificial layer including silicon dioxide deposited or grown on the substrate and etched to create desired holes and/or trenches through to the substrate layer, and a function layer deposited on the sacrificial layer and the exposed portions of the substrate layer and then etched to define micromechanical structures or devices therein. The etching process exposes the sacrificial layer underlying the removed function layer material. The exemplary method further including cleaning residues from the surface of the device, then epitaxially depositing a layer of gap narrowing material selectively on the surfaces of the device. The selection of deposition surfaces determined by choice of materials and the temperature and pressure of the epitaxy carrier gas. The gap narrowing epitaxial deposition continues until a desired gap width is achieved, as determined by, for example, an optical detection arrangement. Following the gap narrowing step, the micromachined structures or devices may be released from their respective underlying sacrificial layer.

DETAILED DESCRIPTION

Figure 1A:
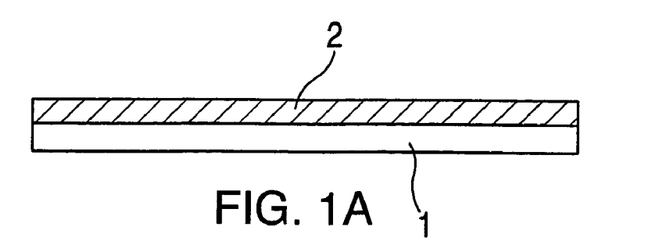
FIGS. 1a through 1f show cross-section and plan views of various stages of preparation of an exemplary micromachined device.
Figure 1B:
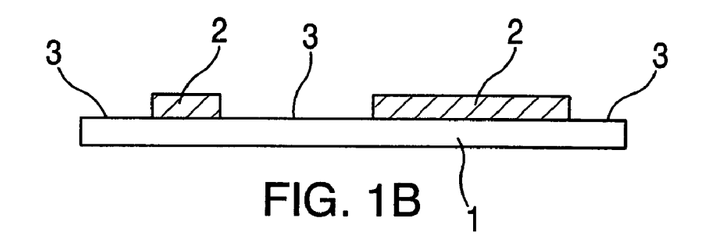
Figure 1C:
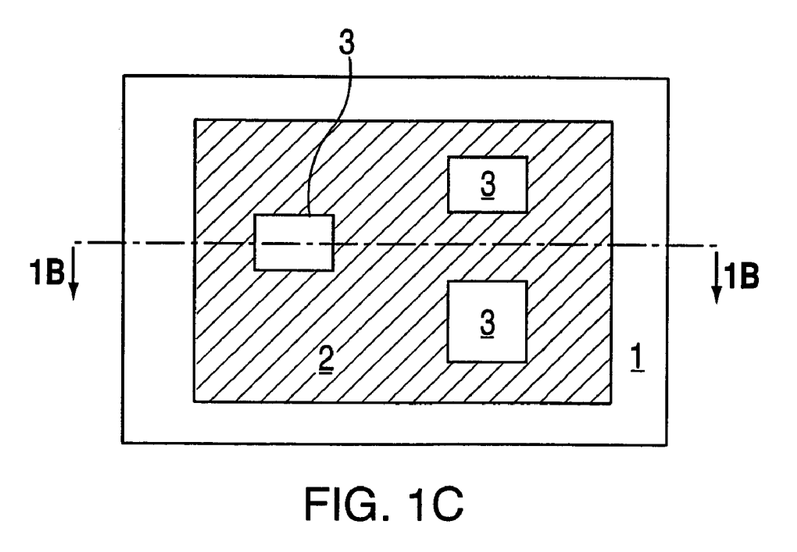

According to an exemplary embodiment of the present invention, a method for gap tuning a micromachined structure or device is provided. As shown in the cross-section view in FIG. 1a, the partially formed device is based on a substrate layer 1 of, for example, substrate silicon, upon which a sacrificial layer 2 of, for example, $SiO_2$ is deposited in an Low Temperature Oxide (LTO) process or thermally grown. FIG. 1b shows a cross-section view of the substrate/sacrificial layer combination of FIG. 1a after a pattern of holes or open areas 3 have been formed in sacrificial layer 2 using etching techniques, for example by application of a photo-sensitive material over the sacrificial layer, applying a mask with the desired etching pattern over the photo-sensitive material, exposing the masked surface to light, and then applying etchants to remove the exposed portions of the photo-sensitive material then the sacrificial $SiO_2$ underneath the exposed portions. FIG. 1c shows a plan view of the partially formed device of FIG. 1b showing holes defined by the etching process through sacrificial layer 2. The cross-section view in FIG. 1b is taken through the line IB-IB of FIG. 1c.

Figure 1D:
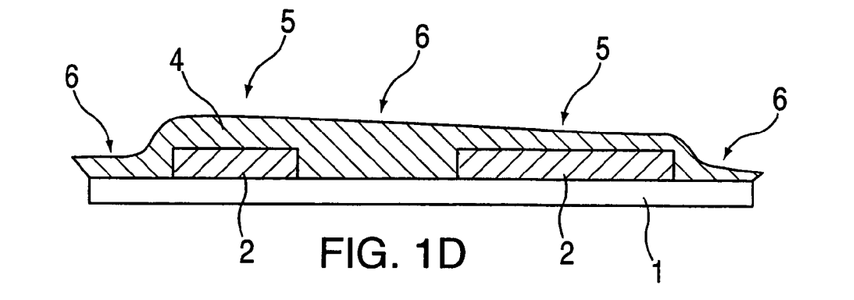
Figure 1E:
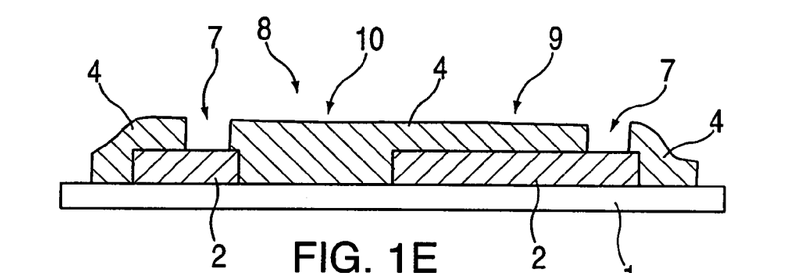

The partially formed device may then receive an epitaxially deposited function layer 4 of, for example, silicon, as shown in the cross-section view FIG. 1d. The portions 5 of the function layer 4 formed on the $SiO_2$ have a polycrystalline structure, while the portions 6 of the function layer 4 formed on the silicon substrate layer 1 have a monocrystalline structure. As shown in FIG. 1e, function layer 4 may then be etched in the previously described manner to define the micromechanical structures or devices in function layer 4. This etching may include deep, narrow trenches 7 etched into the exposed portions of the photo-sensitive material and the underlying polycrystalline silicon of function layer 4. The trench etching processes may penetrate function layer 4 possibly up to the $SiO_2$ of sacrificial layer 2.

Figure 1F:
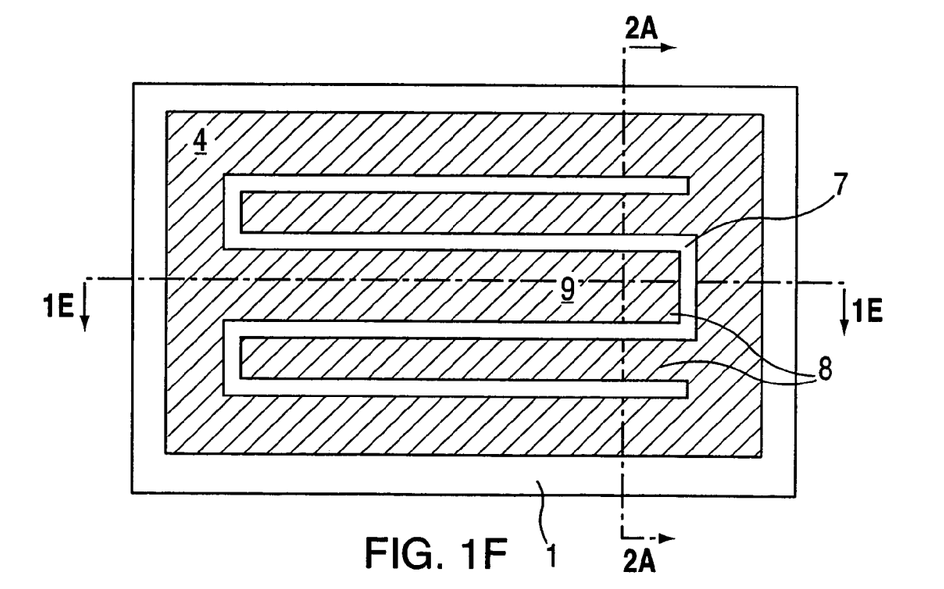

FIG. 1f is a plan view of the partially formed device showing micromechanical elements 8 defined by the etched trenches. The cross-section views in FIG. 1d and FIG. 1e are both taken through the line IE-IE, which also corresponds to line IB-IB of FIG. 1c. Deflection beam portions 9 of micromechanical elements 8 are shown in FIG. 1e extending from base portions 10 of micromechanical elements 8. Base portions 10 may be firmly affixed to the silicon substrate 1, while deflection beam portions 9 may rest upon, and may therefore be restrained by, underlying layer 11 of $SiO_2$ of sacrificial layer 2. This layer of sacrificial material needs to be removed to free deflection beams 9 to deflect from their rest position during operation of the micromechanical device. In an exemplary embodiment, after deflection beams 9 are freed they are free to deflect in a direction perpendicular to their longitudinal axes. This movement results in a change in gaps 7 between the beams, which may in turn cause detectable changes in the capacitance between the beams.

With the partially formed device manufactured to the point of having the trenches 7 etched through functional layer 4, the process of altering the width of the gaps between micromechanical elements 8 to precisely the desired gap may proceed.

If a $SiO_2$ hard mask is present as a result of prior device fabrication steps, it may remain in place on the device, as it may be removed during the subsequent micromechanical element release steps, and it may minimize the deposition of gap-filling material on the upper surfaces of the device, where it may not be needed.

Following the cleaning steps, the gap tuning process may continue with deposition of an epitaxially grown layer of material such as monocrystalline silicon, polycrystalline silicon, germanium, and/or SiGe on the partially formed device. The preferred choice of material to be epitaxially deposited may be determined by the nature of the material to be coated and the geometry of the gap to be narrowed. For example, the function layer may be formed from monocrystalline silicon. The preferred gap narrowing material may be carried in the epitaxial environment by an $H_2$ flow. The environmental parameters of the $H_2$ flow, including temperature, pressure, and the chemical composition of the gap narrowing material, may be varied to achieve selective deposition of the gap narrowing material on the various regions of the device. For example, if silicon is to be deposited to narrow the trenches 7, one of silane, dichlorosilane, or trichlorosilane may be provided. HCl may be included to cause the silicon deposition to be more selective, i.e., to cause the silicon to deposit on the surfaces of the micromechanical elements 8 formed in function layer 4, but not on the exposed surfaces of the $SiO_2$ of sacrificial layer 2.

Figure 2A:
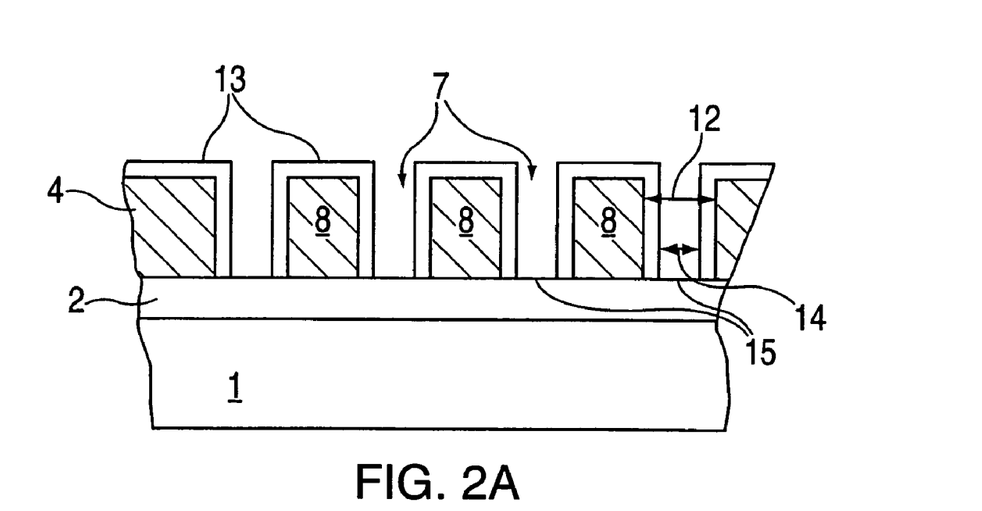
FIG. 2a illustrates an exemplary embodiment of the present invention showing the addition of material to the exemplary micromachined device.

An illustration of this selective deposition is shown in FIG. 2a. FIG. 2a is a partial cross-section of the device taken along the line IIA-IIA shown in FIG. 1f/FIG. 2a depicts the arrangement of micromechanical elements 8 separated from one another and their respective adjacent sections of function layer 4 by trenches 7. Prior to initiating the gap narrowing process, the trenches 7 are wider than desired, as indicated by the width shown by arrow 12. Once the deposition of the gap narrowing material is initiated, the material may begin to build-up a deposited layer 13 on the upper surface of function layer 4 and micromechanical elements 8 and on the vertical sides of trenches 7. Deposited layer 13 may increase in thickness as the epitaxial deposition process continues, until a desired thickness is reached, corresponding to a desired inter-element gap 14. In this exemplary embodiment, because sacrificial layer 2 is composed of $SiO_2$ and process parameters are controlled to provide selective deposition, no gap narrowing material is deposited at trench bottoms 15. In other words, the process parameters are adjusted to cause selective deposition in which the gap narrowing material deposits on the function layer, but not on the sacrificial ($SiO_2$) layer. This ensures that the portions of sacrificial layer 11 underlying micromechanical elements 8 remain exposed to facilitate their possible subsequent removal to free micromechanical elements 8.

Figure 2B:
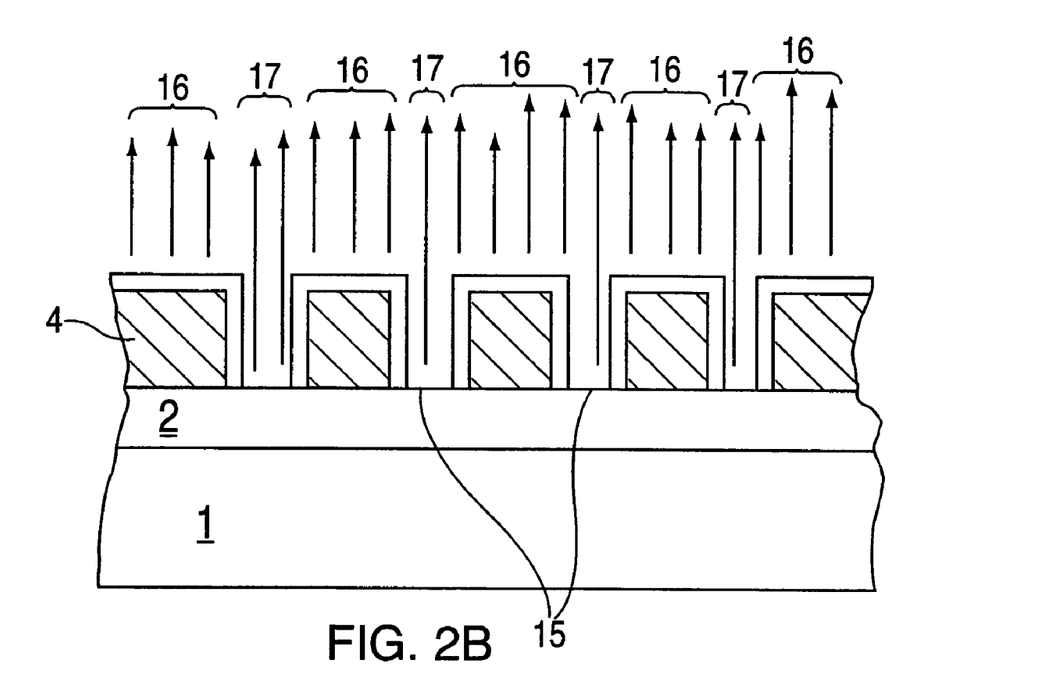
FIG. 2b illustrates an exemplary method for detecting the desired inter-element gap width.

The termination of epitaxial of gap narrowing material may be controlled in a variety of ways. For example, the gap narrowing deposition process may proceed in a step-wise fashion, with periodic halts to permit close examination of the extent of gap narrowing thus far achieved. Preferably, the gap narrowing material deposition may be completed in one step, with periodic or continuous monitoring of gap width occurring throughout the formation of deposition layer 13. Such in-process gap width monitoring and deposition termination control may be performed by an optical end-point detection system. An optical system suitable for use with the present invention may detect gap thickness by, for example, looking at an interference pattern of reflected light from the surface of the device. Alternatively, as in the exemplary embodiment illustrated in FIG. 2b, an optical system may compare the reflected light from higher surfaces 16 and reflected light from lower surfaces 17 at the bottom of trenches 7.

Figure 3:
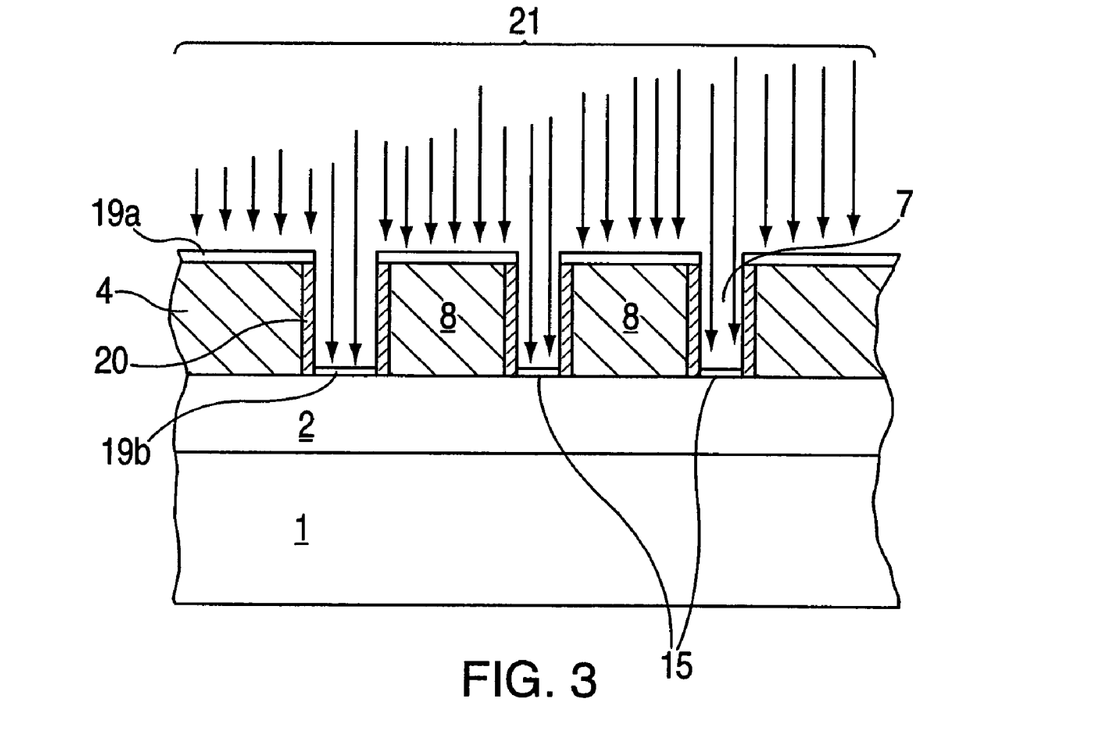
FIG. 3 shows the exemplary embodiment of FIGS. 2a and 2b undergoing sputtering to remove undesired epitaxially deposited material.

An illustration of non-selective deposition in accord with an exemplary embodiment of the present invention is shown in FIG. 3. FIG. 3 is a partial cross-section of the device taken along the line IIA-IIA shown in FIG. 1f. FIG. 3 depicts the arrangement of micromechanical elements 8 separated from one another and their respective adjacent sections of function layer 4 by trenches 7. The deposition of the gap narrowing material may cause build-up of deposited layer 13 on the upper surface of function layer 4 and micromechanical elements 8 and on the vertical sides of trenches 7. In this exemplary embodiment, the process parameters are controlled to provide non-selective deposition, and therefore the gap narrowing material deposits everywhere. Therefore, since sacrificial layer 2 is composed of $SiO_2$ and the process parameters are controlled to provide non-selective deposition, the gap narrowing material may be deposited at trench bottoms 15. Furthermore, FIG. 3 shows the results of a highly conformal deposition, and therefore the deposition of the gap narrowing material is uniform between the top (portions 19a) and trench bottoms 15 (portions 19b). In an alternative, non-conformal deposition, the deposition rate may be higher at the top (portions 19a) than trench bottoms 15 (portions 19b). A method for removing portions 19b of deposited layer 13 on the bottom of trenches 7 and portions 19a on top of micromechanical elements 8, while leaving portions 20 of deposited layer 13 arranged on the vertical sidewalls of micromechanical elements 8, may be desirable. FIG. 3 shows an exemplary method for removing portions 19a and 19b of deposited layer 13 by sputtering. Sputtering may involve ionizing particles, for example Argon, in a plasma region above the surface of the device, then accelerating the ions in an electrostatic field in the direction of arrows 21. The ions may then impact the surface of the device, thereby imparting mechanical energy to the surface of the device, thereby dislodging particles from the surface. This sputtering may therefore have the effect of removing material in a mostly uniform manner from surfaces perpendicular to arrows 21. Therefore, the vertical sidewalls of micromechanical elements 8 may remain relatively untouched by the ions, and may therefore retain some or all of portion 20 of deposited layer 13.

Following completion of the gap narrowing process, micromechanical elements 8 may be released from their underlying columns of sacrificial layer material using any method. Metals may be added to the device after the gap tuning and prior to micromechanical element release process steps.

In an alternative exemplary embodiment an SOI (Silicon On Insulator) wafer may be utilized. The insulator layer of the SOI wafer may form a sacrificial layer and a top silicon layer of the SOI wafer may form the top layer.

Figure 4:
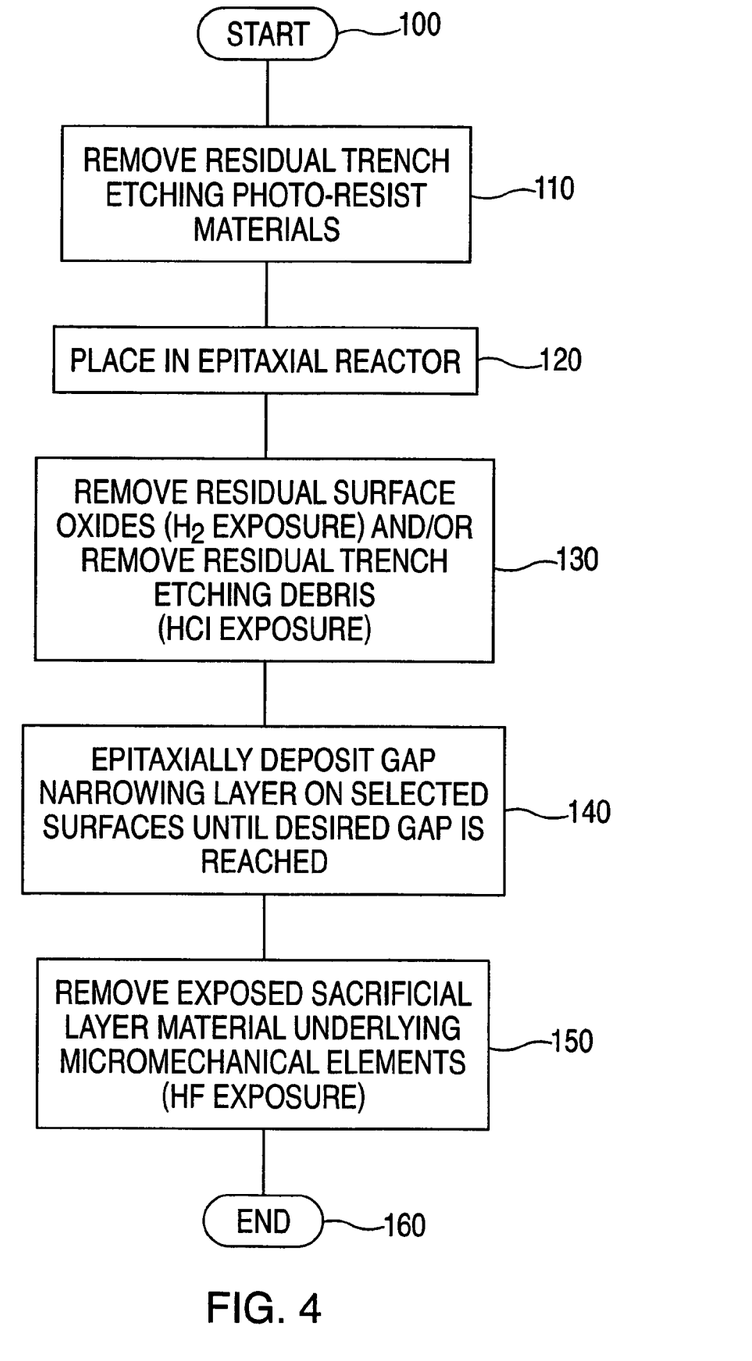
FIG. 4. is a flowchart illustrating steps for achieving the desired inter-element gap width in accordance with an exemplary embodiment of the present invention.

FIG. 4 is a flowchart showing a detailed implementation of an exemplary method for tuning the gap between micromechanical elements and releasing the micromechanical elements from the underlying sacrificial layer. The process method starts at step 100 with a device into which trenches have been etched to define an element of a micromechanical structure or device. In step 110, which is an optional step in the method, residual materials from the trench etching process may be removed. Step 110 is followed by step 120, placing the device in an epitaxial reactor. Step 120 is followed by step 130, removing residual oxides from the surface of the micromechanical device that remain following the trenching process by exposing the surface of the device to $H_2$ gas and/or removing silicon residues remaining following the trenching process by exposing the surface of the device to HCl. Alternatively, step 130 may be skipped, and the flow may proceed directly from step 120 to step 140. Step 130 is followed by step 140, epitaxially depositing a gap narrowing material on selected surfaces of the device until a desired inter-element gap width is achieved. After step 140, the device may be removed from the epi-reactor. Step 150 removes the exposed sacrificial layer material by flowing HF gas over the device. Step 150 is also optional depending on the desired device, and therefore the flow may proceed directly from step 140 to step 160. Step 160 marks the end of the micromechanical element gap tuning and release portion of a micromachined device manufacturing process.

Figure 5:
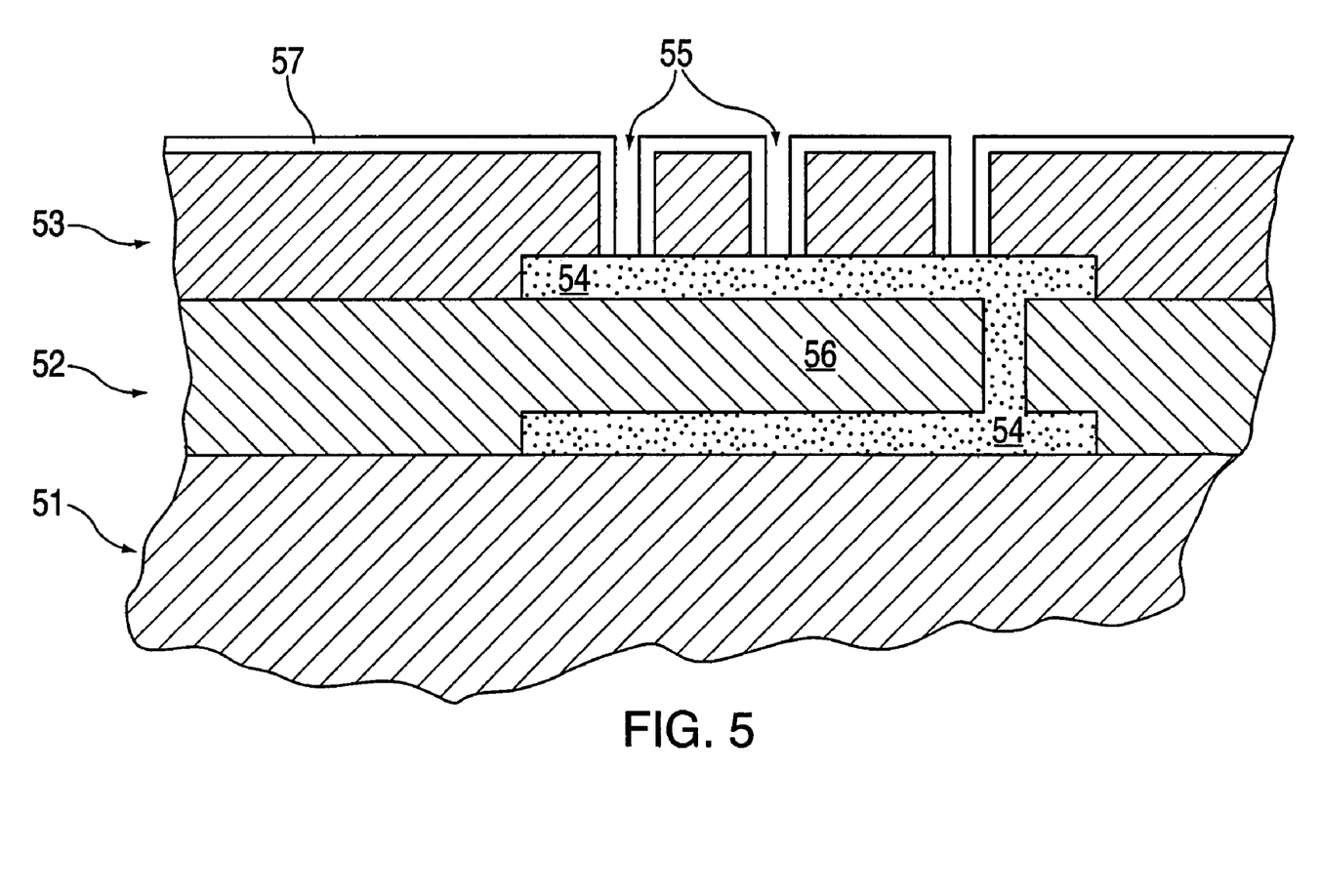
FIG. 5 shows a cross-section of an exemplary device having multiple layers.

FIG. 5 shows handle wafer 51, which may be a silicon wafer, with device layer 52 arranged above handle wafer 51 and defining a cavity which is filled by sacrificial material 54. Encapsulation layer 53 is arranged on top of device layer 52 and includes vents 55 which access sacrificial material 54. Vents 55 may be gap tuned in the manner described above by depositing gap-tuning layer 57. In a subsequent process step, sacrificial material 54 may be etched or release using any appropriate technique. In this manner, an exemplary device having multiple function layers and multiple sacrificial layers may be constructed, which may include vents 55 tuned by gap-tuning layer 57 as well as device 56. In an alternative exemplary embodiment, more sacrificial layers and more function layers may be arranged above encapsulation layer 53.

While the present invention has been described in connection with the foregoing representative embodiment, it should be readily apparent to those of ordinary skill in the art that the representative embodiment is exemplary in nature and is not to be construed as limiting the scope of protection for the invention as set forth in the appended claims.

What is claimed is:

1. A device comprising:
   a substrate;
   a top layer having at least two opposing faces extending over an exposed portion of the substrate;
   at least two epitaxially deposited layers, each of the at least two epitaxially deposited layers situated on a respective one of the at least two opposing faces, a combined thickness of the at least two epitaxially deposited layers tuning a gap between the at least two opposing faces; and
   a sacrificial layer deposited on a first portion of the substrate layer;
   wherein:
   the top layer includes at least one function layer epitaxially deposited on at least a second portion of the sacrificial layer;
   the sacrificial layer includes silicon dioxide; and
   during the deposition of the gap narrowing layer, deposition on the sacrificial layer is selectively avoided by adjusting at least one of a temperature, a pressure, and a gas composition of the epitaxial reactor.

2. The device of claim 1, wherein at least one of the at least two epitaxially deposited layers includes at least one of a silicon layer, a germanium layer and a silicon/germanium layer.

3. The device of claim 1, wherein the at least two opposing faces define at least one micromechanical element in the top layer of the device.

4. The device as recited in claim 1, further comprising:
   a further sacrificial layer arranged below the substrate layer;
   wherein the further sacrificial layer is released from the substrate layer by exposing the device to gaseous hydrogen.

5. The device of claim 1, further comprising an SOI wafer, an insulator layer forming the sacrificial layer and a top silicon layer forming the top layer.

6. The device of claim 1, wherein at least one of the at least two epitaxially deposited layers is deposited in an environment including one of silane, dichlorosilane, and trichlorosilane, the one of silane, dichlorosilane, and trichlorosilane entrained in an $H_2$ flow.

7. The device of claim 1, wherein the at least two epitaxially deposited layers are deposited in an epitaxy reactor environment.

8. The device of claim 1, wherein the gap between the at least two opposing faces defines a tuned gap width for at least one micromechanical element arranged on the device.

9. The device of claim 1, wherein the at least two epitaxially deposited layers are deposited in a single process operation.

* * * * *